(12) United States Patent
Lin (10) Patent No.: US 12,211,704 B2
(45) Date of Patent: Jan. 28, 2025

(54) SEMICONDUCTOR PACKAGE HAVING SIDE WALL PLATING

(71) Applicant: SILICONIX INCORPORATED, San Jose, CA (US)

(72) Inventor: Barry Lin, Kaohsiung (TW)

(73) Assignee: Siliconix Incorporated, San Jose, CA (US)

( * ) Notice: Subject to any disclaimer, the term of this patent is extended or adjusted under 35 U.S.C. 154(b) by 622 days.

(21) Appl. No.: 17/436,429

(22) PCT Filed: Mar. 8, 2019

(86) PCT No.: PCT/US2019/021276
§ 371 (c)(1),
(2) Date: Sep. 3, 2021

(87) PCT Pub. No.: WO2020/185193
PCT Pub. Date: Sep. 17, 2020

(65) Prior Publication Data
US 2022/0172961 A1    Jun. 2, 2022

(51) Int. Cl.
*H01L 21/48* (2006.01)
*H01L 21/56* (2006.01)
(Continued)

(52) U.S. Cl.
CPC ........ *H01L 21/4842* (2013.01); *H01L 21/561* (2013.01); *H01L 23/3107* (2013.01); *H01L 23/49575* (2013.01); *H01L 23/49582* (2013.01)

(58) Field of Classification Search
CPC .............................................. H01L 23/49575
See application file for complete search history.

(56) References Cited

U.S. PATENT DOCUMENTS 5,801,432 A    9/1998  Rostoker et al.
5,976,912 A   11/1999  Fukutomi et al.
(Continued)

FOREIGN PATENT DOCUMENTS

EP    1966743 B1    2/2011
EP    1958133 B1    3/2011
(Continued)

OTHER PUBLICATIONS

Rogren, Philip E. et al. "A High Performance and Cost Effective Molded Array Package Substrate." (2010).
(Continued)

*Primary Examiner* — Yu-Hsi D Sun
(74) *Attorney, Agent, or Firm* — Volpe Koenig (57) ABSTRACT

Methods are disclosed herein for forming wettable flanks on quad flat no-leads semiconductor packages. The methods may begin with a package assembly having multiple non-singulated packages. The package assembly includes a lead frame assembly having dies coupled thereto. A mold encapsulation covers the dies and exposes portions of leads. An electroplating step deposits plating on the exposed portions of the leads. First and second series of parallel step cuts are made between the die packages to form sidewalls of wettable flanks. The first and second series of parallel step cuts are perpendicular to each other. These cuts are made at a depth to cut fully through the lead frame but not fully through the mold encapsulation. After the first and second series of parallel step cuts, the wettable flanks are plated using an electroless method. A third and fourth series of cuts singulates the assembly into discrete QNF semiconductor packages.

13 Claims, 11 Drawing Sheets

(51) Int. Cl.
*H01L 23/31* (2006.01)
*H01L 23/495* (2006.01)

(56) References Cited

U.S. PATENT DOCUMENTS

| | | | |
|---|---|---|---|
| 6,001,671 | A | 12/1999 | Fjelstad |
| 6,219,908 | B1 | 4/2001 | Farnworth et al. |
| 6,238,952 | B1 | 5/2001 | Lin |
| 6,400,004 | B1 | 6/2002 | Fan et al. |
| 6,498,099 | B1 | 12/2002 | McLellan et al. |
| 6,608,366 | B1 | 8/2003 | Fogelson et al. |
| 6,774,659 | B1 | 8/2004 | Chiang |
| 6,872,599 | B1 | 3/2005 | Li et al. |
| 6,888,231 | B2 | 5/2005 | Maeda |
| 6,987,034 | B1 | 1/2006 | Chiang |
| 7,119,421 | B2 | 10/2006 | Rohrmoser et al. |
| 7,183,630 | B1 | 2/2007 | Fogelson et al. |
| 7,645,635 | B2 | 1/2010 | Wood et al. |
| 7,719,094 | B2 | 5/2010 | Wu et al. |
| 7,816,186 | B2 | 10/2010 | San Antonio et al. |
| 7,943,431 | B2 | 5/2011 | San Antonio et al. |
| 8,017,447 | B1 | 9/2011 | Olsen |
| 8,071,427 | B2 | 12/2011 | Celaya et al. |
| 8,076,181 | B1 | 12/2011 | Pruitt et al. |
| 8,093,097 | B2 | 1/2012 | Lange et al. |
| 8,159,826 | B2 | 4/2012 | Dijkstra et al. |
| 8,329,509 | B2 | 12/2012 | Gong et al. |
| 8,395,399 | B2 | 3/2013 | Rousseville et al. |
| 8,436,460 | B1 | 5/2013 | Gamboa et al. |
| 8,437,141 | B2 | 5/2013 | Rogy et al. |
| 8,535,982 | B1 | 9/2013 | Abdo et al. |
| 8,541,786 | B2 | 9/2013 | Boomen et al. |
| 8,642,461 | B2 | 2/2014 | Huening |
| 8,685,795 | B2 | 4/2014 | Wang |
| 8,728,929 | B2 | 5/2014 | Van Kempen et al. |
| 8,809,121 | B2 | 8/2014 | Li et al. |
| 8,968,510 | B2 | 3/2015 | Rogy et al. |
| 9,006,034 | B1 | 4/2015 | Sirinorakul |
| 9,018,537 | B2 | 4/2015 | Karrer |
| 9,070,669 | B2 | 6/2015 | Daniels et al. |
| 9,099,486 | B2 | 8/2015 | Merz et al. |
| 9,153,529 | B2 | 10/2015 | Van Kempen et al. |
| 9,206,794 | B2 | 12/2015 | Gridelet |
| 9,281,284 | B2 | 3/2016 | Yap et al. |
| 9,287,200 | B2 | 3/2016 | Higgins, III |
| 9,324,637 | B1 | 4/2016 | Bai et al. |
| 9,379,071 | B2 | 6/2016 | Kamphuis et al. |
| 9,391,007 | B1 | 7/2016 | Yeung et al. |
| 9,418,919 | B2 | 8/2016 | Groenhuis et al. |
| 9,425,130 | B2 | 8/2016 | Leung et al. |
| 9,443,791 | B2 | 9/2016 | Leung et al. |
| 9,461,009 | B1 | 10/2016 | Higgins, III et al. |
| 9,466,585 | B1 | 10/2016 | Kamphuis et al. |
| 9,472,528 | B2 | 10/2016 | Yap |
| 9,538,659 | B2 | 1/2017 | Viswanathan et al. |
| 9,589,928 | B2 | 3/2017 | Bai et al. |
| 9,606,079 | B2 | 3/2017 | Merz |
| 9,607,918 | B2 | 3/2017 | Gong et al. |
| 9,640,463 | B2 | 5/2017 | Lam et al. |
| 9,673,150 | B2 | 6/2017 | Gong et al. |
| 9,741,692 | B2 | 8/2017 | Karhade et al. |
| 9,779,349 | B2 | 10/2017 | Rogy et al. |
| 9,847,283 | B1 | 12/2017 | Ke et al. |
| 9,935,079 | B1 | 4/2018 | Foong et al. |
| 9,966,326 | B2 | 5/2018 | Mustanir et al. |
| 9,974,174 | B1 | 5/2018 | Wenzel et al. |
| 10,079,198 | B1 | 9/2018 | Cadag et al. |
| 10,083,866 | B2 | 9/2018 | Bin Mohd Arshad et al. |
| 10,199,311 | B2 | 2/2019 | Truhitte et al. |
| 10,410,941 | B2 | 9/2019 | Leung et al. |
| 2002/0063315 | A1 | 5/2002 | Huang et al. |
| 2003/0006055 | A1 | 1/2003 | Chien-Hung et al. |
| 2004/0046240 | A1 | 3/2004 | Hasebe et al. |
| 2005/0116321 | A1 | 6/2005 | Li et al. |
| 2007/0126092 | A1 | 6/2007 | San Antonio et al. |
| 2008/0006937 | A1 | 1/2008 | Matsunami |
| 2008/0206588 | A1 | 8/2008 | Lange et al. |
| 2008/0230926 | A1 | 9/2008 | Dijkstra et al. |
| 2008/0246132 | A1 | 10/2008 | Kasuya et al. |
| 2008/0246312 | A1 | 10/2008 | Katoh |
| 2008/0268578 | A1 | 10/2008 | Shimanuki et al. |
| 2008/0308310 | A1 | 12/2008 | Rogy et al. |
| 2008/0309462 | A1 | 12/2008 | Rogy et al. |
| 2009/0079044 | A1 | 3/2009 | Wu et al. |
| 2010/0187663 | A1 | 7/2010 | Celaya et al. |
| 2010/0253372 | A1 | 10/2010 | Rousseville et al. |
| 2011/0033315 | A1 | 2/2011 | Gridelet |
| 2011/0147925 | A1 | 6/2011 | Van Kempen et al. |
| 2011/0244629 | A1 | 10/2011 | Gong et al. |
| 2011/0309514 | A1 | 12/2011 | Boomen et al. |
| 2012/0181678 | A1 | 7/2012 | Groenhuis et al. |
| 2013/0334619 | A1 | 12/2013 | Merz et al. |
| 2013/0334695 | A1 | 12/2013 | Tijssen et al. |
| 2013/0341734 | A1 | 12/2013 | Merz |
| 2014/0167238 | A1 | 6/2014 | Jeon et al. |
| 2014/0357022 | A1 | 12/2014 | Stacey |
| 2015/0035166 | A1 | 2/2015 | Letterman, Jr. et al. |
| 2015/0294924 | A1 | 10/2015 | Bai et al. |
| 2015/0303156 | A1 | 10/2015 | Kamphuis et al. |
| 2016/0005679 | A1 | 1/2016 | Israel et al. |
| 2016/0035651 | A1 | 2/2016 | Leung et al. |
| 2016/0126169 | A1 | 5/2016 | Leung |
| 2016/0148877 | A1 | 5/2016 | Kitnarong |
| 2016/0181122 | A1 | 6/2016 | Eugene Lee et al. |
| 2016/0211197 | A9 | 7/2016 | Groenhuis |
| 2016/0218008 | A1 | 7/2016 | Li et al. |
| 2016/0276251 | A1 | 9/2016 | Mustanir et al. |
| 2016/0372403 | A1 | 12/2016 | Lam et al. |
| 2017/0005030 | A1 | 1/2017 | Kitnarong et al. |
| 2017/0133302 | A1 | 5/2017 | Truhitte et al. |
| 2017/0271249 | A1* | 9/2017 | Kasuya ............ H01L 23/3121 |
| 2017/0338170 | A1 | 11/2017 | Ziglioli |
| 2017/0352610 | A1 | 12/2017 | Sirinorakul |
| 2017/0358514 | A1 | 12/2017 | Yeung et al. |
| 2017/0372988 | A1 | 12/2017 | Groenhuis et al. |
| 2018/0033647 | A1 | 2/2018 | Bin Mohd Arshad et al. |
| 2018/0068920 | A1 | 3/2018 | Leung et al. |
| 2018/0102287 | A1 | 4/2018 | Santos et al. |
| 2018/0358286 | A1 | 12/2018 | Cadag |

FOREIGN PATENT DOCUMENTS

| | | |
|---|---|---|
| EP | 2337068 A1 | 6/2011 |
| EP | 2361000 A1 | 8/2011 |
| EP | 2400534 A1 | 12/2011 |
| EP | 2677540 A1 | 12/2013 |
| EP | 2693465 A1 | 2/2014 |
| EP | 2677307 B1 | 5/2016 |
| EP | 3051592 A1 | 8/2016 |
| EP | 2677306 B1 | 11/2017 |
| EP | 3261115 A1 | 12/2017 |
| EP | 3293760 A1 | 3/2018 |
| EP | 3306660 A2 | 4/2018 |
| EP | 3319122 B1 | 6/2019 |
| EP | 2704192 B1 | 7/2019 |
| JP | 201472236 A | 4/2014 |
| JP | 2016167532 A | 9/2016 |
| JP | 2016219520 A | 12/2016 |
| JP | 2017228559 A | 12/2017 |
| TW | 201019404 A | 5/2010 |
| TW | 201128758 A | 8/2011 |
| TW | 201133655 A | 10/2011 |
| TW | 201803060 A | 1/2018 |
| TW | 1645465 B | 12/2018 |
| WO | 2006/134534 A1 | 12/2006 |
| WO | 2007/052234 A2 | 5/2007 |
| WO | 2007/060631 A1 | 5/2007 |
| WO | 2009/072052 A1 | 6/2009 |
| WO | 2009125250 A1 | 10/2009 |
| WO | 2009/133499 A2 | 11/2009 |
| WO | 2009/144672 A1 | 12/2009 |
| WO | 2010/032192 A1 | 3/2010 |

(56) References Cited

FOREIGN PATENT DOCUMENTS

| WO | 2012040873 A1 | 4/2012 |
|---|---|---|
| WO | 2020/185192 A1 | 9/2020 |
| WO | 2020/185193 A1 | 9/2020 |

OTHER PUBLICATIONS

Koschmieder et al., "Soldering the QFN Stacked Die Sensors to a PC Board," Freescale Semiconductor Application Note, AN3111, Rev. 5 (Apr. 2010).
NXP Semiconductors, "Surface Mount Reflow Soldering," Application Note, Rev. 6, AN10365 (Jul. 30, 2012).
Chip Scale Review, The Future of Semiconductor Packaging, vol. 18, No. 6, (Nov.-Dec. 2014).
Janóczki et al., "Automatic Optical Inspection of Soldering," (2013).
Amkor MicroLeadFrame® Data Sheet, DS572S (2017).
Cision PRWeb, "NXP Introduces LIN Transceiver for Smaller, Lighter and More Cost-Efficient ECU Designs," (Feb. 23, 2012).
NXP Semiconductors, TJA1027: Lin 2.2A/SAE J2602 transceiver, Product data sheet, Rev. 2 (Apr. 24, 2013).
International Preliminary Report on Patentability Chapter I issued Aug. 25, 2021 for PCT International Application No. PCT/US2019/021276.
International Search Report mailed May 13, 2019 for PCT International Application No. PCT/US2019/021276.
J. Ganjei, "Improved QFN Reliability by flank tin plating process after singulation," 2015 10th International Microsystems, Packaging, Assembly and Circuits Technology Conference (IMPACT), 2015, pp. 137-140.

* cited by examiner

SEMICONDUCTOR PACKAGE HAVING SIDE WALL PLATING

CROSS REFERENCE TO RELATED APPLICATION(S)

This application is a 371 application of International Application Serial No. PCT/US2019/021276, filed Mar. 8, 2019, the entire contents of which are hereby incorporated by reference as if fully set forth herein.

BACKGROUND

Flat "no-leads' or "leadless" semiconductor packages electrically and physically couple integrated circuit dies (or "dice") to printed circuit boards ("PCB") with flat leads and without through holes extending through a printed circuit board (PCB). Note that although these packages are referred to as "no-leads" or "leadless" packages, the term "leads" in the present disclosure is used to refer to the flat contact pads present on flat no-leads packages. These packages have no "leads" in the sense that there are no leads that extend past or beyond the outer periphery of the package. Flat no-leads packages may be classified as quad flat no-leads ("QFN") packages, having leads on all four sides of the package, and dual flat no-leads ("DFN") packages, having leads on two opposing sides. Within these packages, one or more integrated circuit dies is encapsulated within a non-conductive molding material. An electrically conductive lead frame, typically made of a metal like copper, is electrically coupled to internal components of the package and exposes leads externally that can be electrically coupled to a PCB. Improvements to flat no-leads packages are constantly being made.

Leadless packages have several advantages over packages having leads extending beyond a perimeter of the package. Such packages may have a low profile as compared to other types of packages. Such packages may take up less space and thereby have a smaller "footprint" on a printed circuit board than conventional packages having leads extending beyond the perimeter of the package. Such leadless packages may also have better thermal performance as compared to packages having leads extending beyond the perimeter of the package.

An issue within the relevant industry as it concerns QFN and DFN packages relates to the inspection of the solder connections to the leads of the packages. In order to ensure proper solder connections to QFN and DFN packages, it is necessary to inspect the connections. These inspections can be performed by x-ray, for example, or by automated optical inspection (AOI). Automated optical inspection (AOI) systems are used to inspect, for example, semiconductor devices and printed circuit boards (PCBs), for defects. QFN and DFN packages can allow for AOI, which is less costly than x-ray inspections, if the leads are oriented in such a manner that the portions of the sides or "flanks" of the leads are wettable by solder, such as by having solder wick up the sides or sidewalls of the exposed leads.

There is therefore the need for an efficient method of manufacturing a QFN package that provides for wettable flanks that thereby allow AOI to confirm proper solder connections.

SUMMARY

In an aspect of the present invention, a method for fabricating a semiconductor package having step-cut wettable flanks, from a package assembly including a lead frame, a plurality of integrated circuit dies mounted on the lead frame, and a mold encapsulation surrounding the lead frame and plurality of integrated circuitry dies, and exposing a plurality of leads is provided. The method includes making a first series of parallel cuts fully through the lead frame and partially through the mold encapsulation, to define sidewalls of the plurality of leads. The method also includes making a second series of parallel cuts perpendicular to the first series of parallel cuts, the second series of parallel cuts being fully through the lead frame and partially through the mold encapsulation, to define sidewalls of the plurality of leads. The method also includes electrolessly plating the sidewalls of the plurality of leads to form wettable flanks.

In another aspect of the invention, a quad flat no-leads ("QFN") semiconductor package is provided. The quad flat no-leads package includes a mold encapsulation, one or more integrated circuit dies disposed within the mold encapsulation, and a lead frame electrically coupled to the one or more integrated circuit dies, wherein a plurality of leads are exposed through a bottom surface, or contact surface, of the mold encapsulation. the mold encapsulation and lead frame define wettable flanks on four sides, the wettable flanks including step-cut sidewalls electrolessly plated with a plating material.

In another aspect of the invention, a quad flat no-leads semiconductor package fabricated through a method for fabricating an integrated circuit package having step-cut wettable flanks, from a package assembly including a lead frame, a plurality of integrated circuit dies mounted on the lead frame, and a mold encapsulation surrounding the lead frame and plurality of integrated circuitry dies, and exposing a plurality of leads is provided. The method for fabricating the semiconductor package includes making a first series of parallel cuts fully through the lead frame and partially through the mold encapsulation, to define sidewalls of the plurality of leads, making a second series of parallel cuts perpendicular to the first series of parallel cuts, the second series of parallel cuts being fully through the lead frame and partially through the mold encapsulation, to define sidewalls of the plurality of leads, electrolessly plating the sidewalls of the plurality of leads to form wettable flanks, and making perpendicular third and fourth series of cuts fully through the mold encapsulation to separate discrete semiconductor packages.

In an aspect of the present invention, a semiconductor package is provided wherein an exposed first surface or first surfaces of the leads and die paddles of a lead frame are plating using a first plating process (e.g., electrolytic plating), and wherein exposed sidewalls of the leads are plated using a second plating process (e.g., electroless plating), and wherein the two plating processes are difference processes.

BRIEF DESCRIPTION OF THE DRAWINGS

A more detailed understanding can be had from the following description, given by way of example in conjunction with the accompanying drawings wherein.

DETAILED DESCRIPTION

Certain terminology is used in the following description for convenience only and is not limiting. The words "right," "left," "top," and "bottom" designate directions in the drawings to which reference is made. The words "a" and "one," as used in the claims and in the corresponding portions of the specification, are defined as including one or more of the referenced item unless specifically stated otherwise. This terminology includes the words above specifically mentioned, derivatives thereof, and words of similar import. The phrase "at least one" followed by a list of two or more items, such as "A, B, or C," means any individual one of A, B or C as well as any combination thereof.

The description provided herein is to enable those skilled in the art to make and use the described embodiments set forth. Various modifications, equivalents, variations, combinations, and alternatives, however, will remain readily apparent to those skilled in the art. Any and all such modifications, variations, equivalents, combinations, and alternatives are intended to fall within the spirit and scope of the present invention defined by claims.

Techniques are disclosed herein for forming step-cut wettable flanks on QFN packages. The techniques begin with a package assembly that includes multiple non-singulated packages. The package assembly includes a lead frame assembly having dies and other internal package components (such as wire bonds) coupled thereto. The dies and other components form different regions of non-singulated packages. The dies and other components are encapsulated within a non-conductive mold encapsulation material (also referred to as a "molding," "mold," "encapsulation," "encapsulation material," or other similar term herein) that covers most of the package components but may leave exposed certain electrical contact pads (referred to herein as "leads") and, possibly, thermal contact pads (referred to herein as "die paddles"). The lead frame provides a continuous electrical connection between one end of the package assembly and the other, and between the various exposed leads and die paddles of the packages. Elements such as wire bonds or tie bars may assist with forming the electrical connection. This electrical connection is used to allow for current flow during electroplating, which may be a first step that occurs in the process.

An electroplating step deposits a protective, conductive plating material that covers the lead frame and allows for solder to adhere to the lead frame. The electroplating is deposited on the exposed surfaces of the lead frame on the bottom of the package. After electroplating the bottom exposed surfaces of the lead frame, a first and a second series of parallel step cuts are made in a first direction and in a second direction between the die packages to form sidewalls that will form wettable flanks. The first and second series of parallel step cuts are perpendicular to each other and are made on the periphery of the dies. These cuts are made at a depth to cut fully through the lead frame but not fully through the surrounding mold encapsulation, to allow the packages to remain as a single assembly for additional handling in subsequent steps. After the first and second series of parallel step cuts, the wettable flanks of the exposed sidewalls are plated using an electroless method, which does not use the application of an electrical current. An electroless method is used because the series of perpendicular cuts through the lead frame electrically isolates each of the die packages.

After the electroless plating, a third and fourth series of parallel cuts, aligned with the original cuts, is made to a width that is smaller than the width of the first and second series of parallel cuts. These cuts are made through the rest of the mold encapsulation material. The third and fourth series of cuts singulate the dies, thereby forming singulated QFN packages with wettable flanks.

Figure 1A:
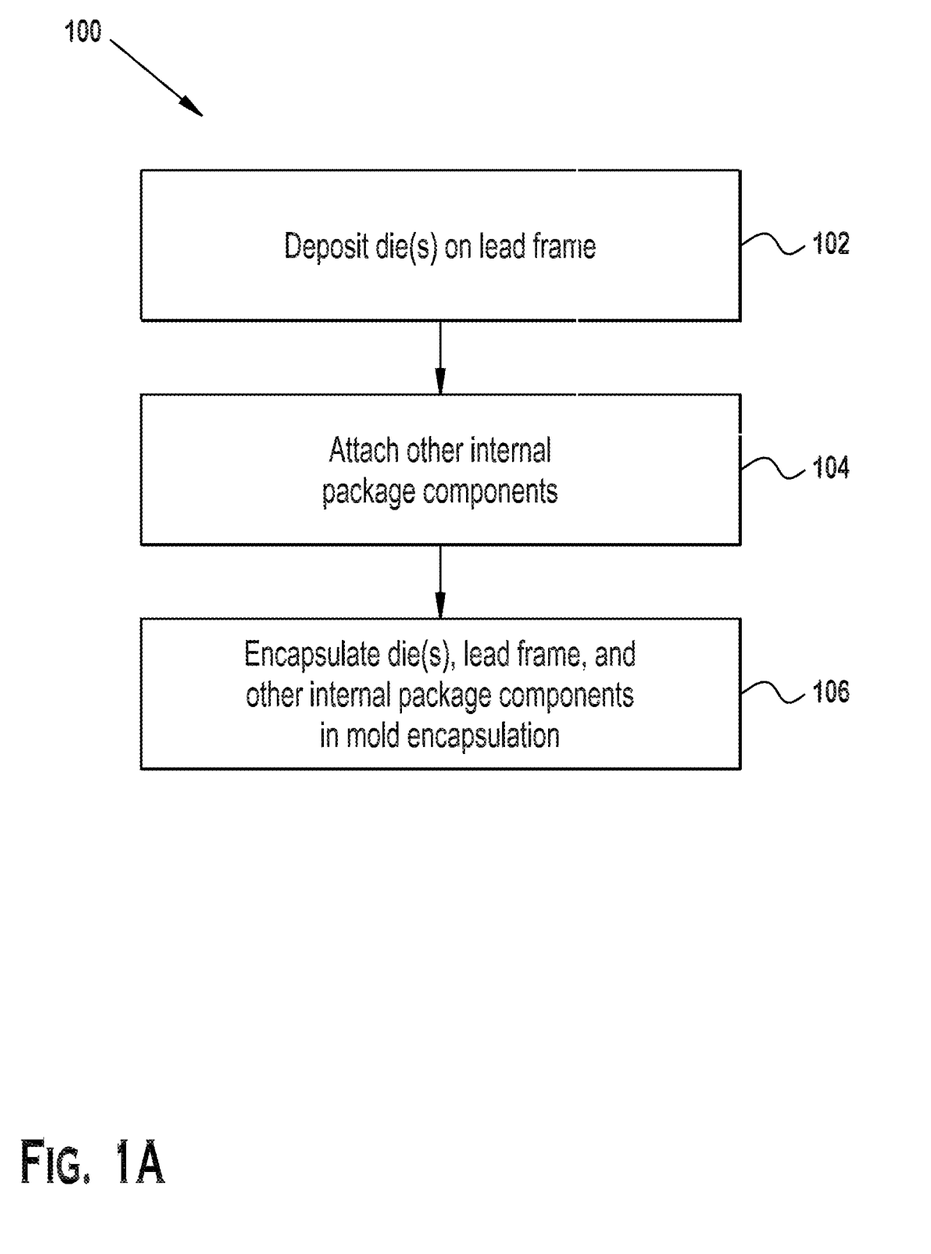
FIG. 1A is a flow diagram of an illustrative method for forming a package assembly, according to an example.

FIG. 1A is a flow diagram of an illustrative method 100 for forming a package assembly, according to an aspect of the present invention. The method 100 begins at step 102, where one or more dies are deposited onto a lead frame assembly. The lead frame assembly includes multiple package lead frames integrated into a single part or unit. The lead frame assembly may include one or more fiducial marks which are marks detectable by a machine that allow the machine to align itself for cutting. The lead frame assembly may be any metal alloy. Die packages are typically formed in an array of die packages which are then cut ("singulated") into individual die packages. To form this array, a single lead frame assembly is cut from a lead frame material such as a sheet of copper. The lead frame assembly has, integrated therein, multiple lead frames corresponding to individual packages. At step 102, one or more of the integrated circuit dies are deposited on the lead frame assembly. At step 104, other components, such as wire bonds, conductive clips (elements within the package that couple the die(s) to one or more leads), or other elements are deposited to form packages. At step 106, a mold encapsulation is deposited around the lead frame and other components of the packages. The mold encapsulation provides a physical and electrical barrier for the components of the package. At the end of method 100 is a package assembly that includes multiple non-singulated package dies with package components (e.g., dies, the lead frame, and the components that couple the dies to the lead frame) encapsulated within a molding material.

Figure 1B:
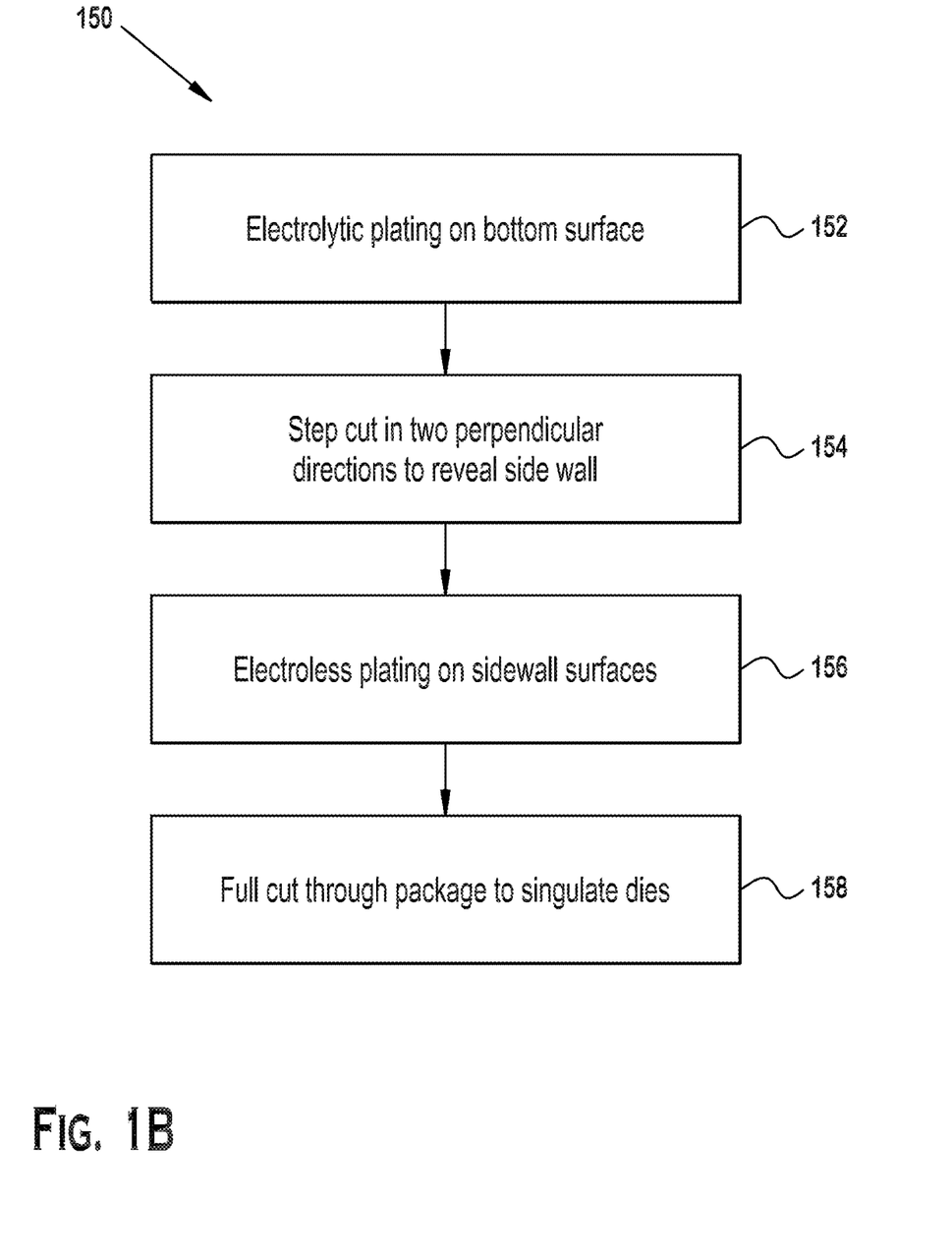
FIG. 1B is a flow diagram of a method for forming wettable flanks on quad flat no-leads packages, according to an example.
Figure 2A:
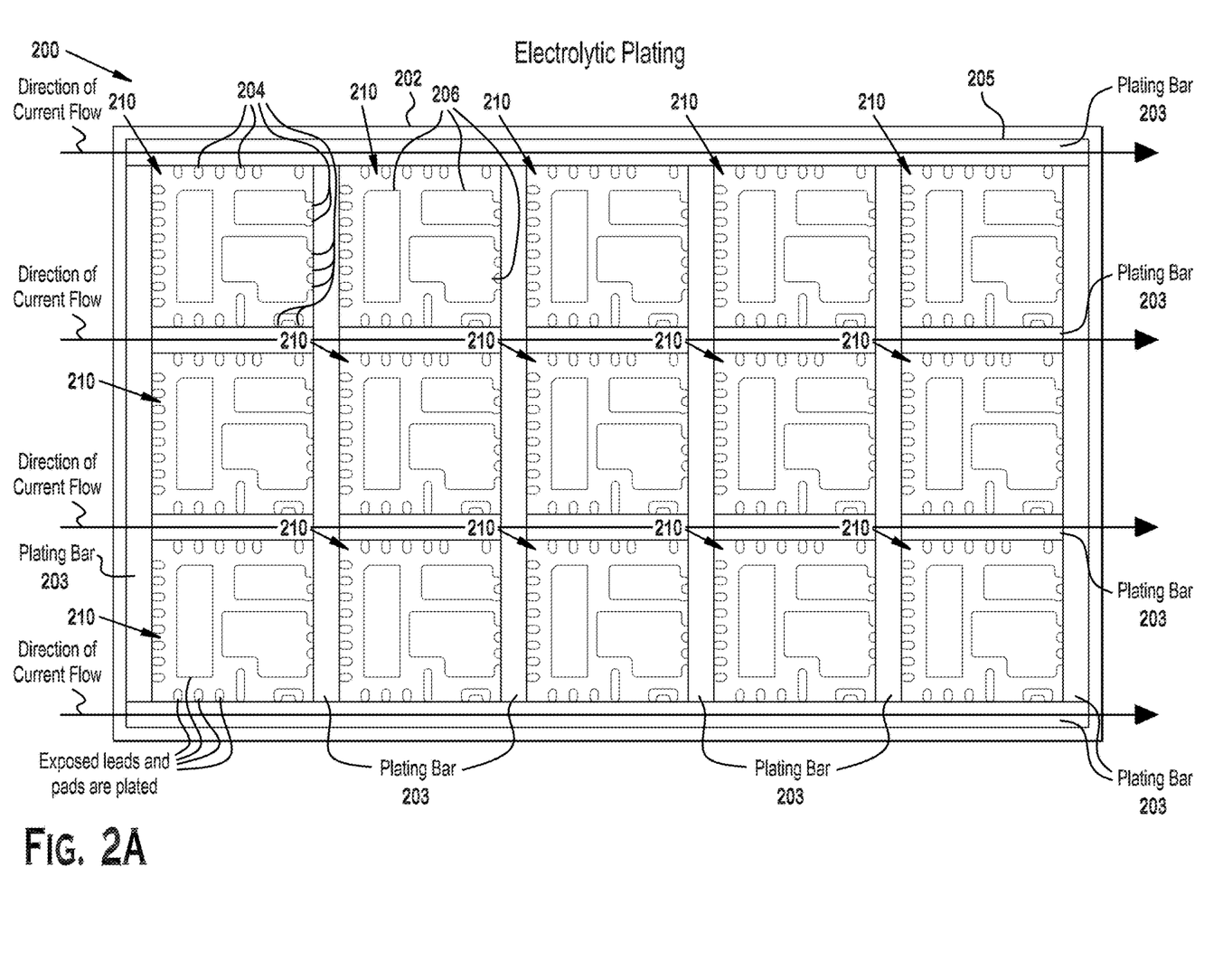
FIG. 2A illustrates application of electrolytic plating to a package assembly, according to an example.

FIG. 1B is a flow diagram of an illustrative method 150 for forming a QFN package according to an aspect of the present invention. The method 150 of FIG. 1B is discussed in conjunction with FIGS. 2A-2E, which illustrate stages of a package assembly as the method 150 proceeds. The method 150 begins with a package assembly 200 that includes a lead frame assembly 205 having one or more dies disposed on and attached thereto. The dies are surrounded by an encapsulation material. A continuous lead frame assembly 205 includes a plurality of plating bars 203, die paddles 206 (or "pads"), and leads 204 on the edges of the packages. These various components are electrically coupled together in FIG. 2A. The leads 204 are formed from a conductive material and are configured to receive plating, described further below, in order to function as the solderable contacts for the package to be connected to a printed circuit board. Non-conductive mold encapsulation material 202 surrounds the lead frame assembly 205.

The package assembly 200 includes an array of uncut (or "joined" or "non-singulated") packages 210. The packages include circuitry elements such as integrated circuit dies, conductive elements such as wire bonds, and other elements that are not shown in FIGS. 2A-2E because these figures show the bottom surface of the package assembly 200. The specific package configuration shown and described in this specification is an example, and details of this configuration should not be taken to be limiting. For example, each package 210 is shown with three die paddles 206, and thus the package 210 includes three dies. Additionally, although a specific number and configuration of leads 204 is shown, the techniques of the present disclosure are applicable to packages 210 having any configuration of leads 204 and/or die paddles 206. Because FIGS. 2A-2E show the bottom surface, or contact surface, of the package assembly 200, the various internal elements such as dies, wire bonds, and others, are not illustrated in these figures.

The plating bars 203 are portions of the lead frame assembly 205 that do not eventually form the lead frame of the individual die packages 210 after the die packages 210 are singulated. The plating bars 203 provide structural integrity and electrical conductivity across the lead frames of the die packages 210 for electroplating.

Referring now to FIG. 1B, at step 152, an electrolytic plating device plates the lead frame assembly 205. Lead frames are typically made of a material such as copper. A layer of a metal such as tin or a tin alloy is plated on the surface of the copper to protect from oxidation and to provide a wettable surface for soldering. In a typical electrolytic plating arrangement, the lead frame is dipped in a bath and the lead frame is electrically coupled to the cathode of an electrolytic plating device. The anode is coupled to the plating material, which is also dipped in the bath. An electrical current is applied to the lead frame which causes the plating material to be deposited on the surface of the lead frame so that the leads 204 and die paddles 206 (FIG. 2A) are plated with the plating material. At this stage, because only the bottom surfaces of the leads 204 and die paddles 206 are exposed, only these surfaces are plated—sidewalls of packages 210, which are not exposed at this stage, are not electrolytically plated. The electrolytic plating may be considered a "first plating layer." The first plating layer may be any of a variety of plating materials, such as tin, gold, palladium, or silver.

Figure 2B:
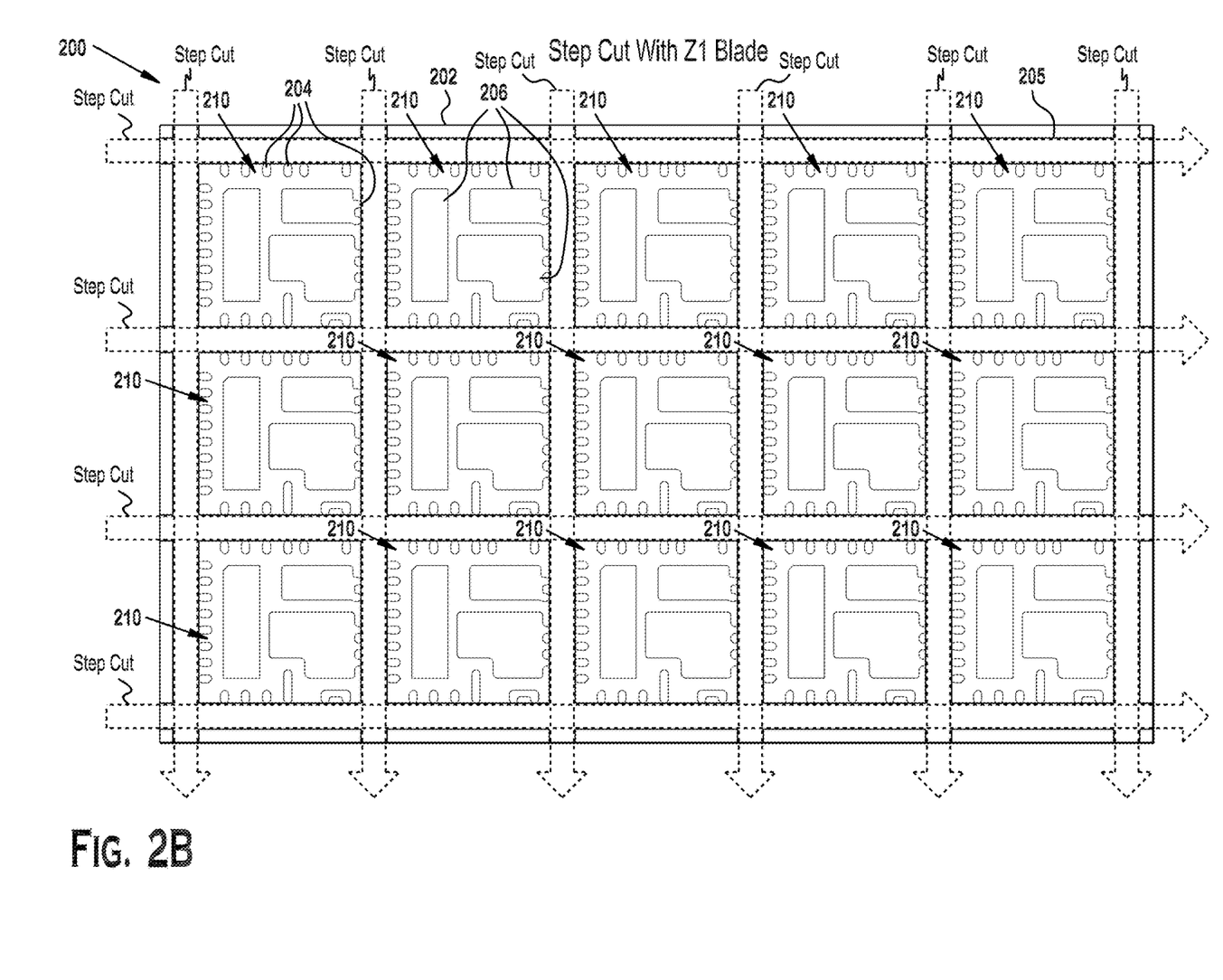
FIG. 2B illustrates the package assembly after perpendicular series of parallel cuts to expose wettable flanks have been made, according to an example.
Figure 2C:
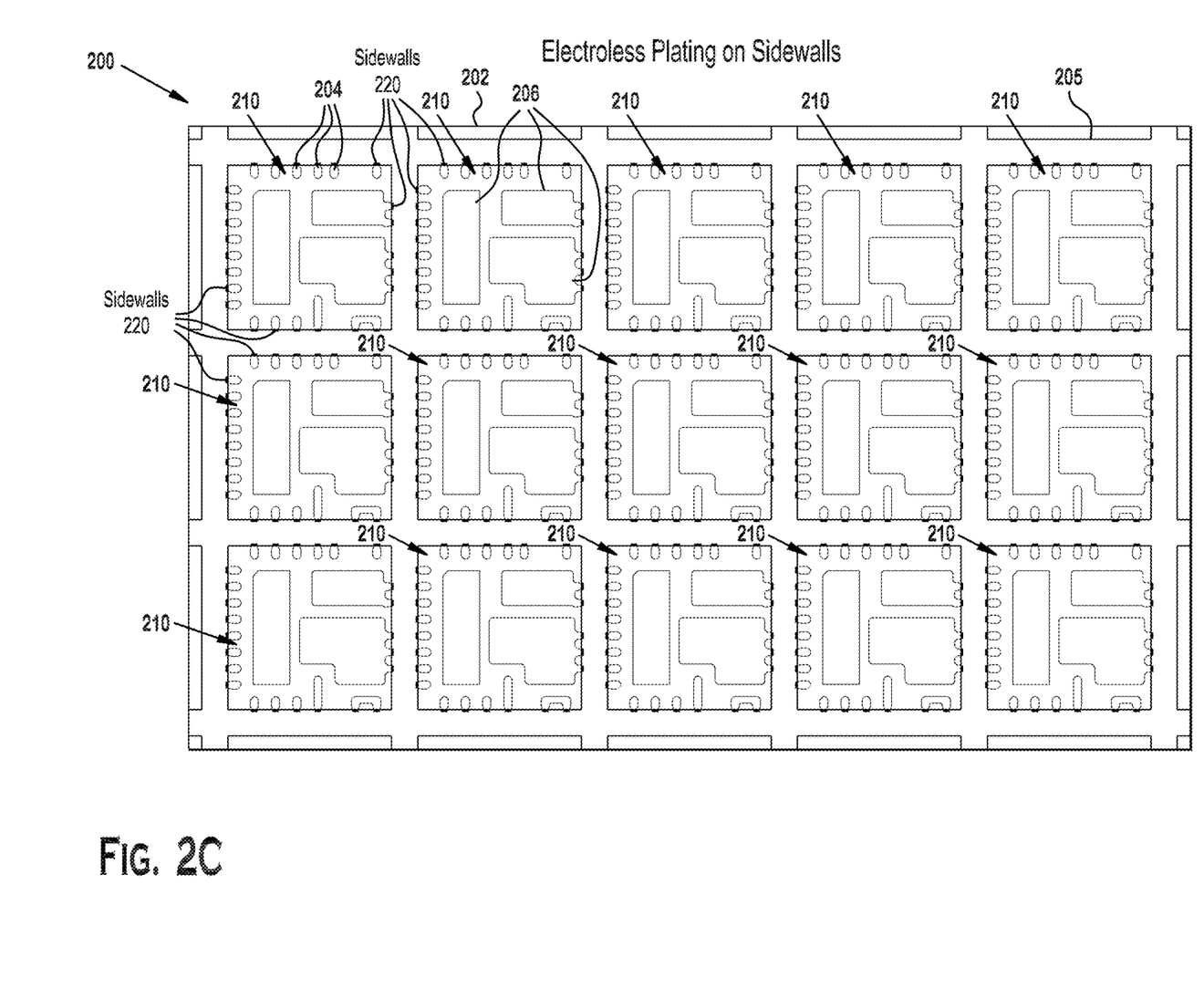
FIG. 2C illustrates electroless plating to sidewalls of wettable flanks, according to an example.

At step 154, a cutting device performs first depth step cuts in two perpendicular directions to form side walls of the leads 204. The cutting device may be, for example, a saw having a saw blade, or may be a laser cutter, a plasma cutter, or a water jet cutter, or any other acceptable cutting technique as known to those of skill in the art. These cuts may be referred to herein as a first series of parallel cuts and a second series of parallel cuts perpendicular to the first series of parallel cuts. This cutting is illustrated in FIG. 2B. The location of the cuts is adjacent to the edges of the leads 204 of the packages 210. The width of the blade used must be sufficient to cut to the edge of the leads 204 of the two adjacent die packages. Further, the cut is made fully through the lead frame but not fully through the corresponding mold encapsulation, which allows the package assembly 200 to be handled as a single unit through subsequent steps. The cutting at step 154 forms sidewalls 220 at portions of the leads 204.

Cutting through the lead frame 205 in two perpendicular directions electrically isolates each of the die packages 210. Thus, at step 156, an electroless plating device is used to electrolessly apply plating to the now-exposed sidewalls 220 of the packages 210 (illustrated in FIG. 2C). Although only a small number of sidewalls 220 are labeled in FIG. 2C, it should be understood that each of the leads 204 of the packages 210 includes sidewalls 220 that are plated with the electroless plating technique.

In the electroless plating technique, the package assembly 200 is dipped in a solution including a plating material (such as tin) and heat is applied. The plating material is deposited on the exposed metallic surfaces, namely, the sidewalls 220 of the leads 204. The electroless plating on the sidewalls may be considered a "second plating layer," and is preferably formed by a different process than the first plating layer. The material of the second plating layer may be any plating material, such as tin, gold, silver, or palladium.

Figure 2D:
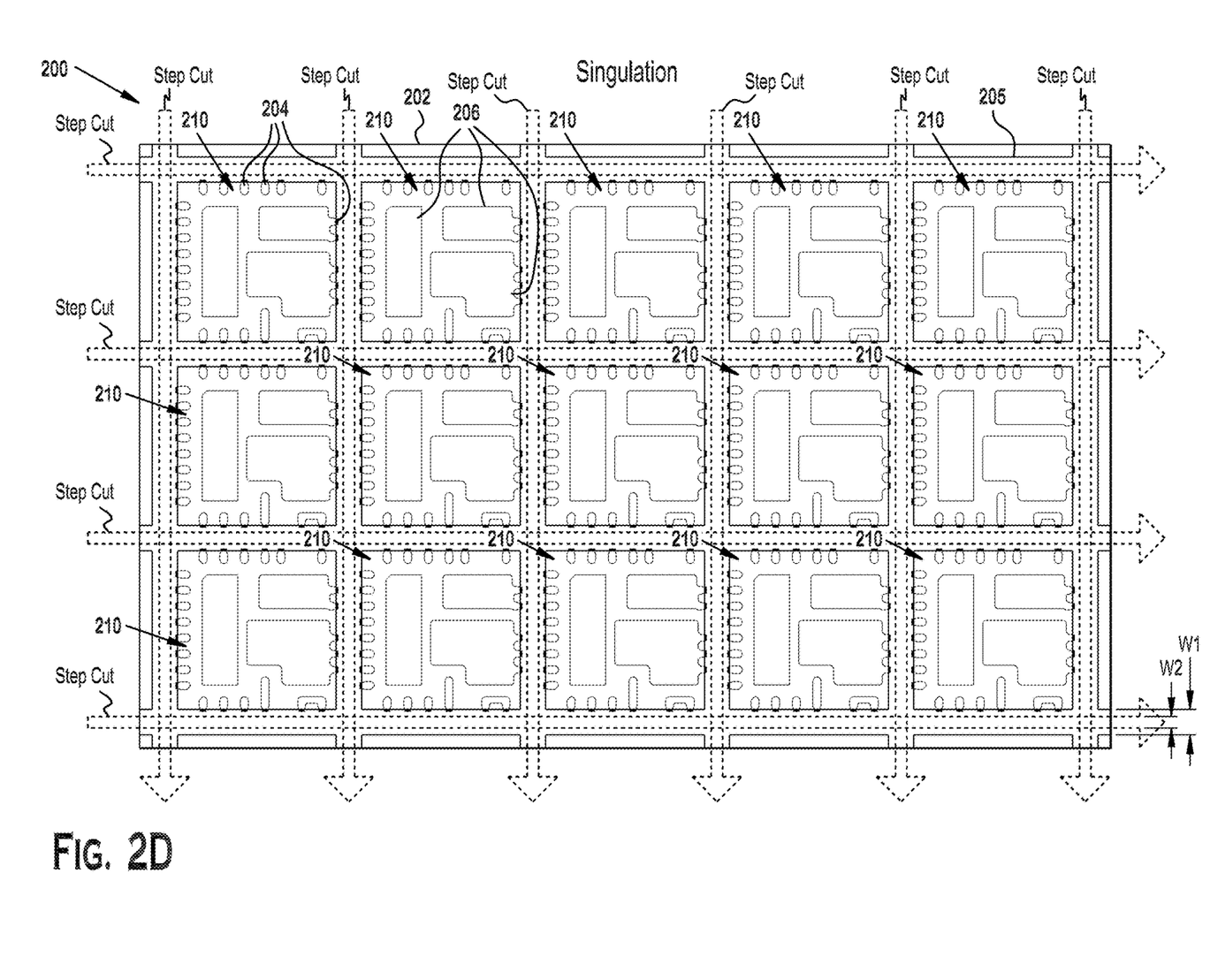
FIG. 2D illustrates third and fourth series of cuts to singulate dies after electroless plating, according to an example.
Figure 2E:
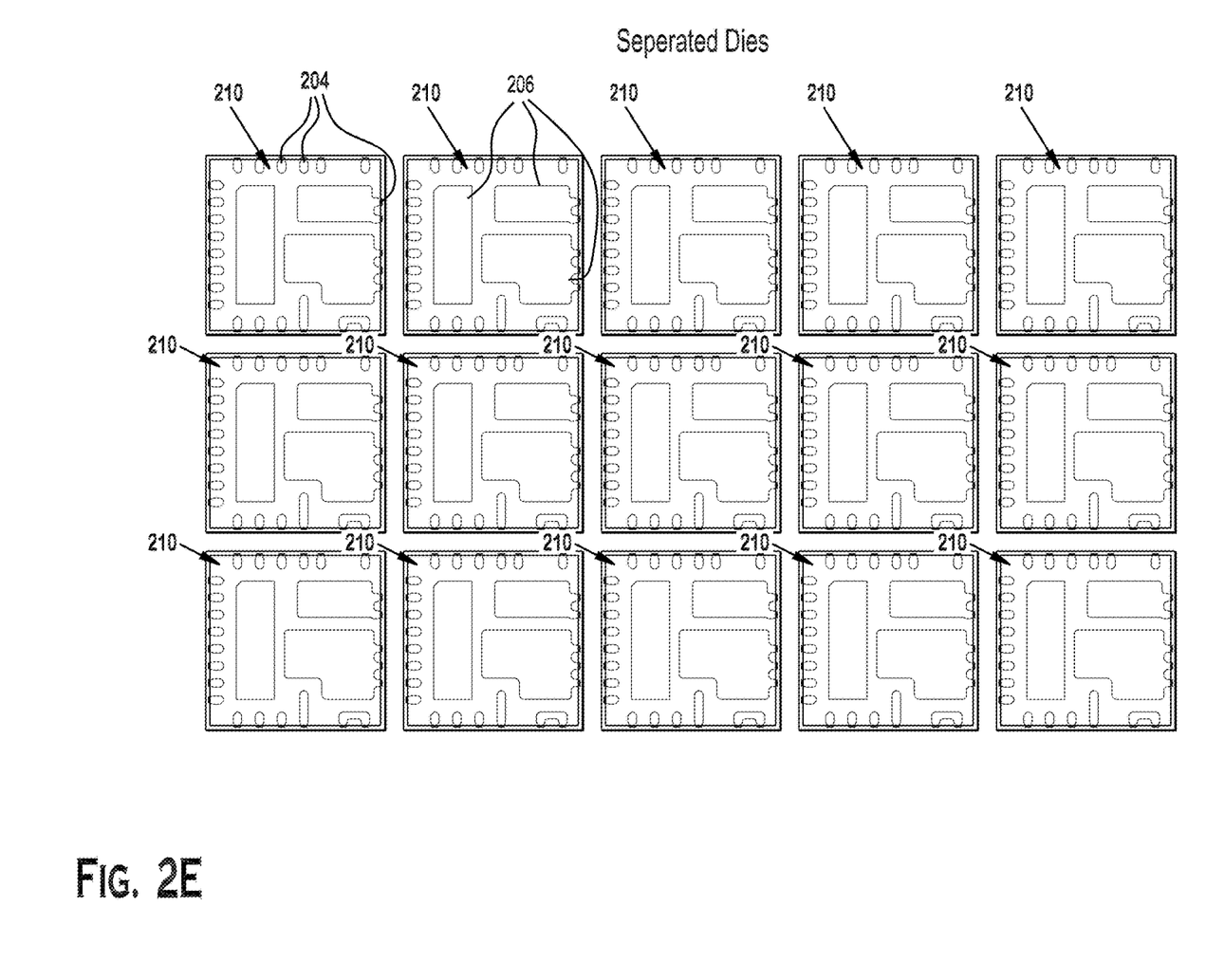
FIG. 2E illustrates singulated dies with wettable flanks, according to an example.

At step 158, a third set of parallel cuts and a fourth set of parallel cuts perpendicular to the third set of parallel cuts are made to singulate the dies and form individual semiconductor packages (shown in FIG. 2D). The blade used to make the third and fourth sets of cuts cut is narrower than the blade used to make the first two cuts of step 154 and as shown in FIG. 2B. The two widths of the step cuts are shown in FIG. 2D as width 1 and width 2. This narrower blade forms a step-cut wettable flank that will allow for a good connection with soldering material and can be optically inspected. FIG. 2E illustrates the singulated packages 210 having wettable flanks.

Figure 3A:
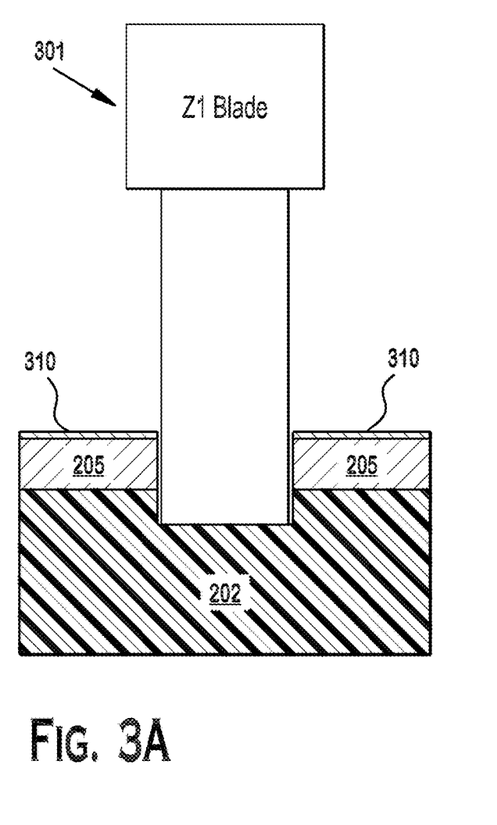
FIG. 3A is a cross-sectional view illustrating the first or second series of cuts of FIG. 2B, according to an example.
Figure 3B:
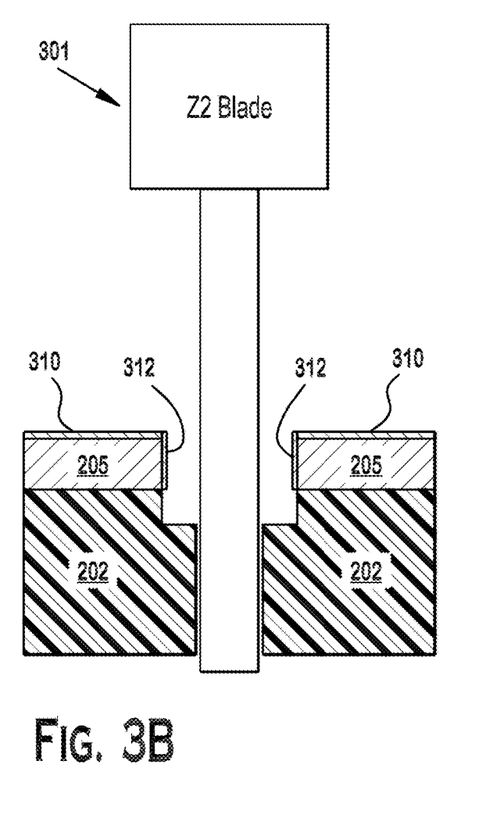
FIG. 3B is a cross-sectional view illustrating the third or fourth series of cuts of FIG. 2D, according to an example.

FIGS. 3A-3B illustrate details related to steps 154 and 158. A cutting device 301 is shown in both figures. FIG. 3A illustrates an example of the first step cut or second step cut (the perpendicular step cuts through the lead frame and only partially into the molding) as described in step 154 and as shown in FIG. 2B. The cut shown in FIG. 3A is made at a first thickness configured to expose the sidewalls 220 of the leads 204 of the packages 210. The cut is shown in FIG. 3A as being made with a saw blade having a thickness labeled "Z1," but any technically feasible means for making the cut could be used, such as a laser cutter, a plasma cutter, or a water jet cutter, or any other acceptable cutting technique as known to those of skill in the art. The electrolytically deposited plating 310 is illustrated deposited over the lead frame 205.

FIG. 3B illustrates an example of the third or fourth series of cuts, which is fully through the encapsulation material that remains after the first and second step cuts of step 154 and FIG. 2B. These full through-cuts singulate the packages 210, resulting in the singulated packages as shown in FIG. 2E. The electrolessly deposited plating material 312 is shown deposited over the lead frame 205.

Figure 3C:
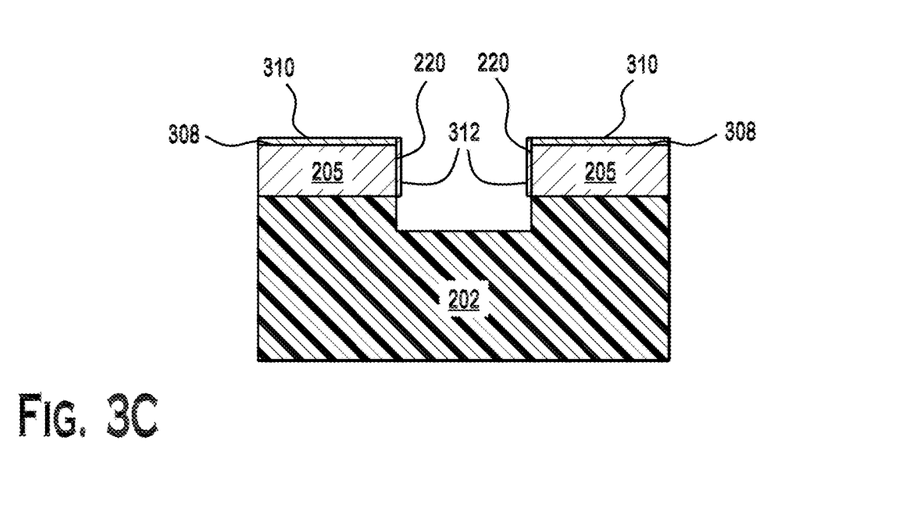
FIG. 3C is a cross-sectional view illustrating electrolytic and electroless plating on wettable flanks of die packages, according to an example.

FIG. 3C illustrates details related to the plated leads 204 after the electroless plating of step 156 but before die singulation. Due to step 152, the surfaces 308 of the lead frame 205 exposed prior to the first and second cuts (step 154 and FIG. 2B) are plated with electrolytically deposited plating 310. Due to steps 154 and 156, the sidewalls 220 are plated with electroless deposited plating 312.

In some examples, the electrolytic plating 310 on the bottom surfaces of the lead frame 205 is thicker than the electroless plating 312 on the sidewalls 220. In some examples, the electrolytic plating 310 is, for example, approximately three times as thick as the electroless plating 312. In some examples, the electrolytic plating 310 is greater than or equal to three times as thick as the electroless plating 312. In some examples, the electrolytic plating 310 is thicker than the electroless plating 312 because these different platings serve different purposes. Specifically, the electrolytic plating 310 may serve to mount the die 210 to a PCB, while the electroless plating 312 serves to electrically couple the package 210, through solder, to a PCB.

Figure 4A:
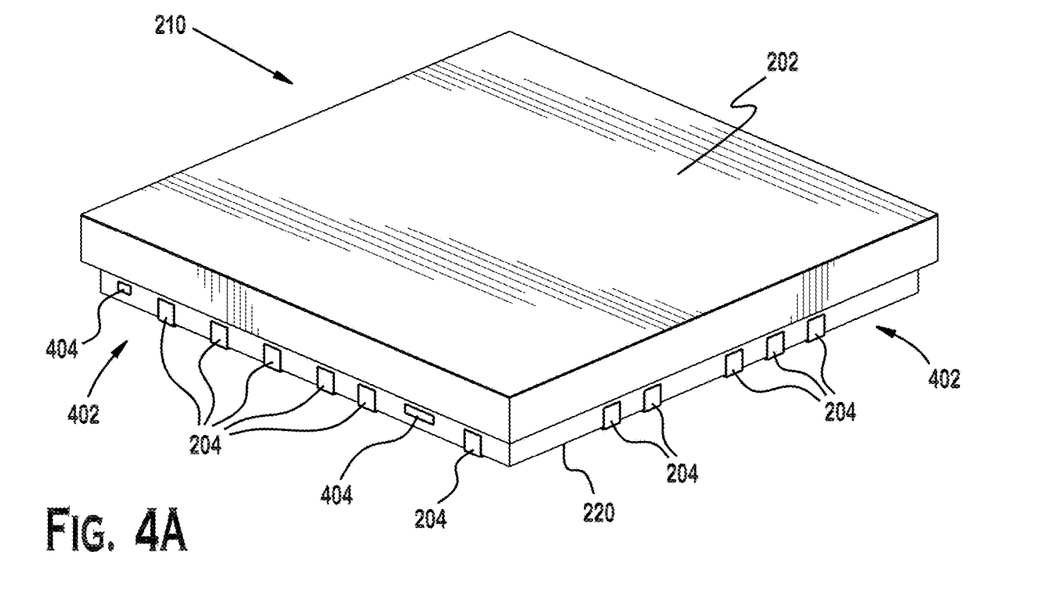
FIG. 4A illustrates a top orthographic view of a singulated die having wettable flanks, according to an example.
Figure 4B:
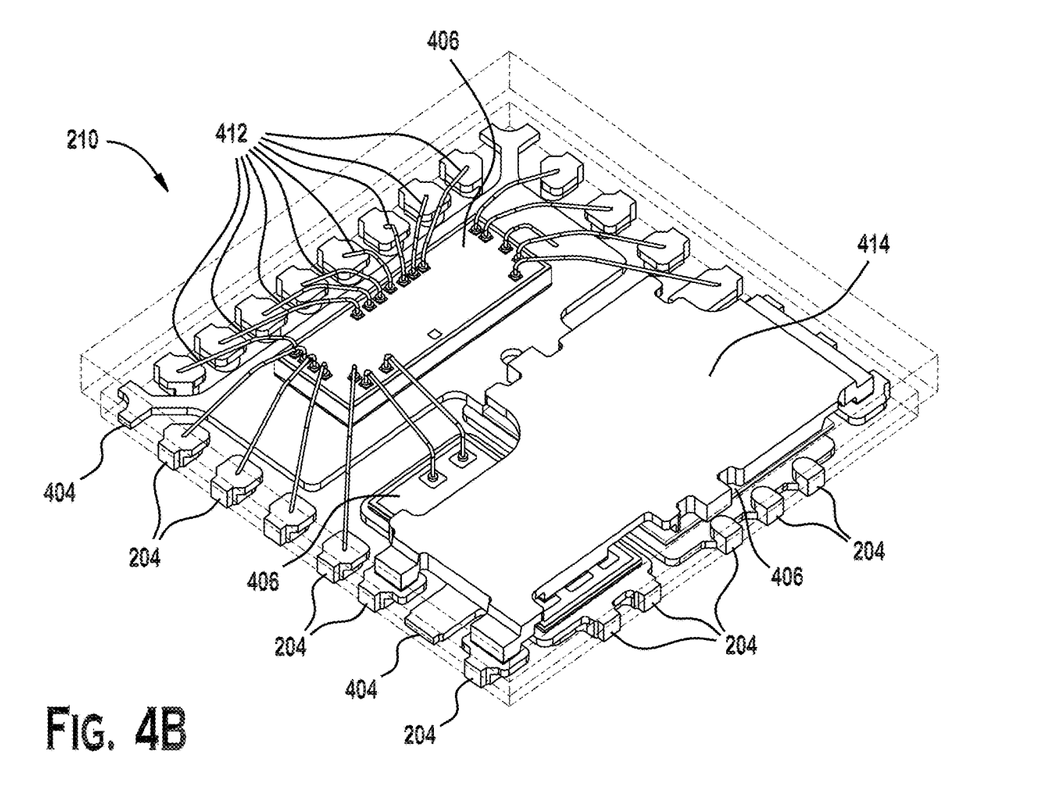
FIG. 4B illustrates a transparent top orthographic view of a singulated die having wettable flanks, according to an example.
Figure 4C:
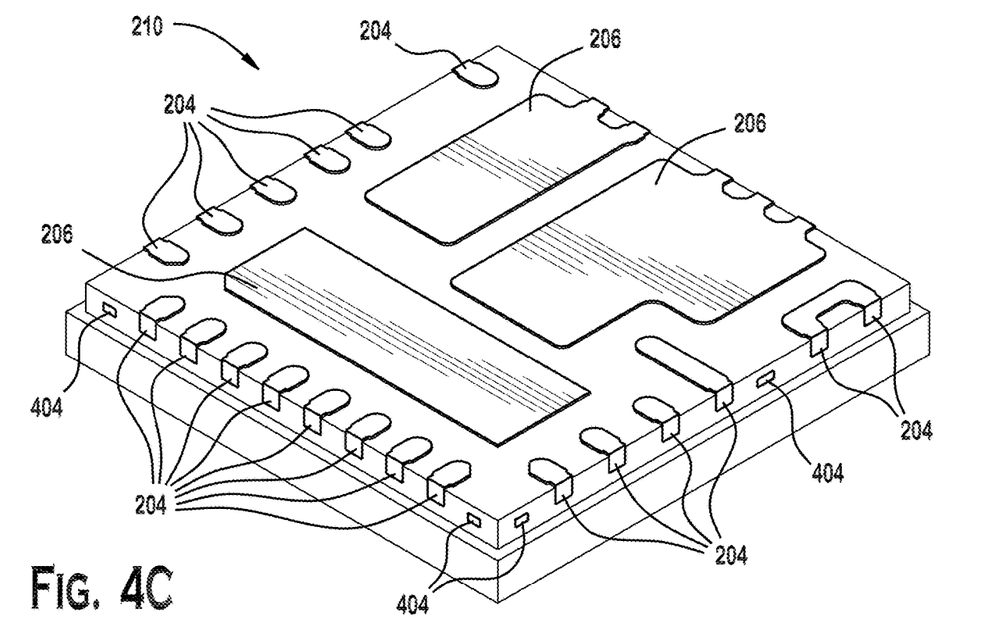
FIG. 4C illustrates a bottom orthographic view of a singulated die having wettable flanks, according to an example.
Figure 4D:
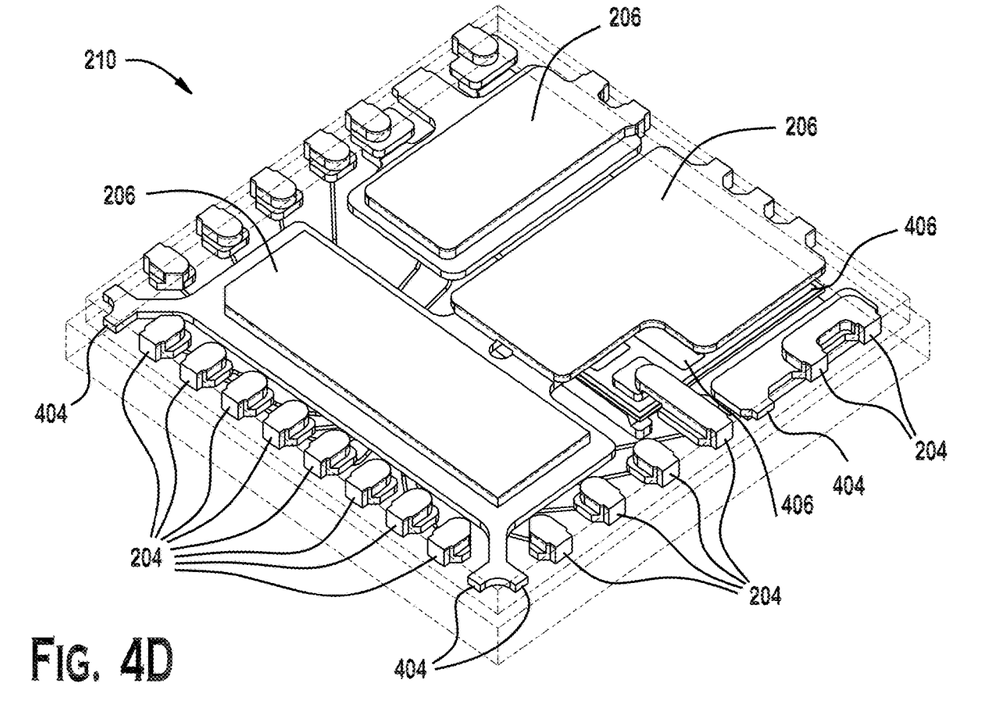
FIG. 4D illustrates a transparent bottom orthographic view of a singulated die having wettable flanks, according to an example.

FIGS. 4A-4D illustrate different views of a singulated semiconductor die package 210, illustrating the step-cut wettable flanks formed according to the method 100 of FIG. 1. FIGS. 4A and 4B illustrate orthographic views, illustrating the top and sides of the package 210 and FIGS. 4C and 4D illustrate orthographic views, illustrating the bottom and sides of the package. The conductive mounting or contact surfaces of the semiconductor package, shown at the bottom of FIGS. 4A and 4B may be considered the lower or bottom surfaces of the package, depending on the orientation, and are the surfaces that will be mounted to, contact and face a printed circuit board. In the orientation of the semiconductor package shown in FIGS. 4C and 4D, the conductive mounting or contact surfaces are shown at the top.

Referring to FIGS. 4A-4D together, the package 210 depicted includes a mold encapsulation 202 and has step-cut wettable flanks 402 with electroless plating formed in accordance with the technique described in FIG. 1. The step-cut wettable flanks 402 include the portions of the die package 210 at which the three cuts of steps 154 and 158 are made and also include the leads 204 that are electrolessly plated. Edges of tie bars 404 electrically coupled to portions of the lead frame 205 internal to the mold encapsulation 202 are also revealed in the step-cut wettable flanks 402. FIGS. 3C and 3D illustrate the bottom surfaces of the leads 204 and die paddles 206, which, as described elsewhere herein, are electrolytically plated.

Internally, the illustrated package includes three dies 406. The dies are mounted on, and may be thermally coupled to die paddles 206, which are a part of the lead frame 205. Wire bonds couple the dies 406 to the leads 204 of the lead frame 205. A clip 414 electrically couples one or more leads 204 to one or more dies 406.

Figure 5A:
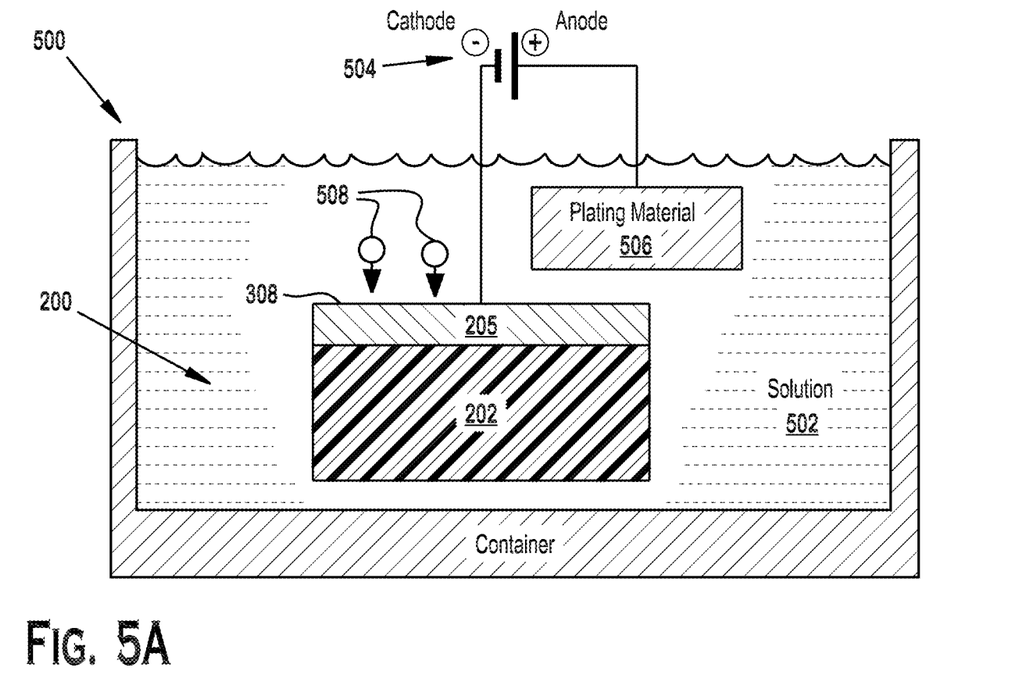
FIG. 5A illustrates an electrolytic plating technique, according to an example.

FIG. 5A illustrates an illustrative electrolytic plating technique. Such a technique could be used for example as part of step 152, illustrated in FIG. 2A. According to the technique, in an electroplating device 500, the package assembly 200 (only a part of which is shown in FIG. 5A) is placed into a solution 502. The cathode of a power source 504 is electrically coupled to the lead frame 205 and the anode of the power source 504 is coupled to a plating material 506. When current is applied by the power source 504, plating material 508 is deposited onto the exposed surfaces of the lead frame 205.

Figure 5B:
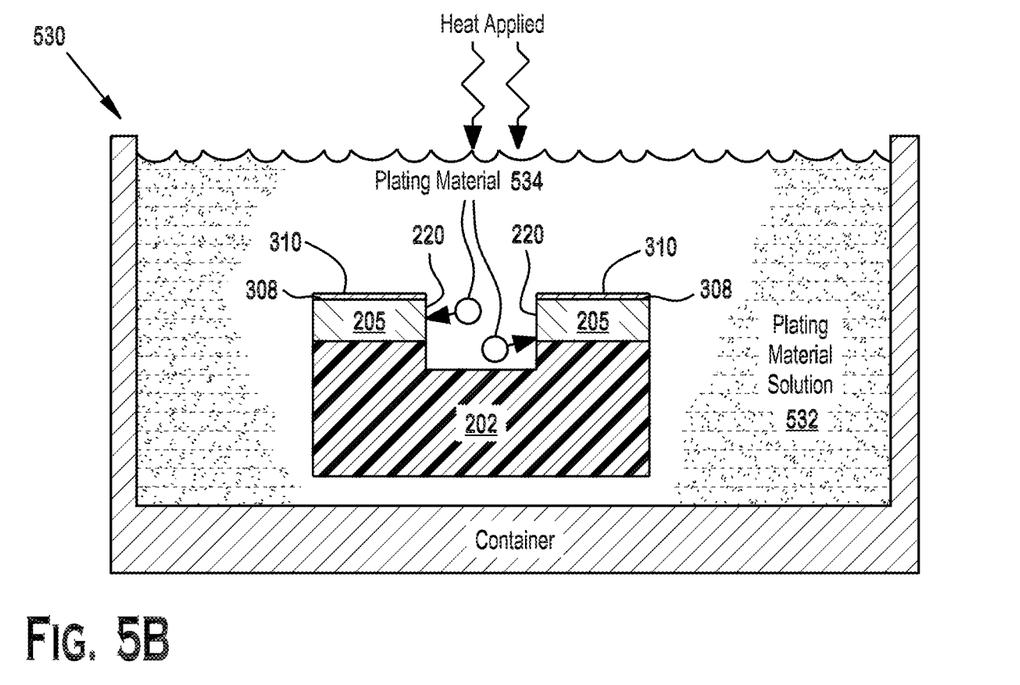
FIG. 5B illustrates an electroless plating technique, according to an example.

FIG. 5B illustrates an electroless plating technique, according to an example. Such a technique could be used for example as part of step 156 of method 100, which is the application of electroless plating to the sidewalls 220 of the step-cut wettable flanks According to the technique, in an electroless plating device 530, the package assembly 200 (only a part of which is shown in FIG. 5B) is placed into a plating material solution 532 and a heating device applies heat. Due to the presence of the heat, plating material 534 is deposited onto the exposed surfaces of the lead frame 205. In FIG. 5B, these exposed surfaces include the sidewalls 220 of the leads 204.

It will be appreciated that the foregoing is presented by way of illustration only and not by way of any limitation. It is contemplated that various alternatives and modifications may be made to the described embodiments without departing from the spirit and scope of the invention. Having thus described the present invention in detail, it is to be appreciated and will be apparent to those skilled in the art that many physical changes, only a few of which are exemplified in the detailed description of the invention, could be made without altering the inventive concepts and principles embodied therein. It is also to be appreciated that numerous embodiments incorporating only part of the preferred embodiment are possible which do not alter, with respect to those parts, the inventive concepts and principles embodied therein. The present embodiment and optional configurations are therefore to be considered in all respects as exemplary and/or illustrative and not restrictive, the scope of the invention being indicated by the appended claims rather than by the foregoing description, and all alternate embodiments and changes to this embodiment which come within the meaning and range of equivalency of said claims are therefore to be embraced therein.

What is claimed is:

1. A method for fabricating a semiconductor package from a package assembly comprising a lead frame comprising a plurality of leads, at least one integrated circuit die mounted on the lead frame, and a mold encapsulation surrounding at least portions of the lead frame while leaving exposed contact surfaces of the plurality of leads, the method comprising:
    electrolytically plating the exposed contact surfaces of the plurality of leads of the lead frame to form an electrolytic plating;
    making a first series of parallel cuts fully through the lead frame and at least partially through the mold encapsulation to define a first series of sidewalls of the plurality of leads;
    making a second series of parallel cuts perpendicular to the first series of parallel cuts, the second series of parallel cuts being fully through the lead frame and at least partially through the mold encapsulation to define a second series of sidewalls of the plurality of leads; and
    electrolessly plating the first series of sidewalls and the second series of sidewalls to form wettable flanks by dipping the package assembly in a solution comprising a plating material and applying heat to form an electroless plating on the first series of sidewalls and the second series of sidewalls;
    wherein the electrolytic plating has a first thickness, the electroless plating has a second thickness, and the first thickness and the second thickness differ.

2. The method of claim 1, wherein electrolytically plating the exposed contact surfaces of the plurality of leads comprises:
    dipping the package assembly in a solution,
    electrically coupling a power source to the lead frame and to a plating material in the solution, and
    applying current to the lead frame via the power source.

3. The method of claim 1, wherein:
the electrolytic plating on the exposed surfaces of the plurality of leads of the lead frame is thicker than the electroless plating on the first and second series of sidewalls of the plurality of leads.

4. The method of claim 3, wherein:
the electrolytic plating on the exposed surfaces of the plurality leads of the lead frame is approximately three times thicker than the electroless plating on the first and second series of sidewalls of the plurality of leads.

5. The method of claim 1, further comprising:
making a third series of cuts and a fourth series of cuts perpendicular to the third series of cuts fully through the mold encapsulation to separate discrete semiconductor packages.

6. The method of claim 5, wherein a width of the first and second series of parallel cuts is greater than a width of the third and fourth series of cuts.

7. The method of claim 1, wherein the lead frame comprises copper and at least one of the electrolytic plating or the electroless plating comprises tin.

8. A method for fabricating a semiconductor package from a package assembly comprising a lead frame comprising a plurality of leads, at least one integrated circuit die mounted on the lead frame, and a mold encapsulation surrounding at least portions of the lead frame while leaving exposed contact surfaces of the plurality of leads, the method comprising:
electrolytically plating the exposed contact surfaces of the plurality of leads to form an electrolytic plating;
making a first series of parallel cuts fully through the lead frame and partially through the mold encapsulation to define a first series of sidewalls of the plurality of leads;
making a second series of parallel cuts perpendicular to the first series of parallel cuts, the second series of parallel cuts being fully through the lead frame and partially through the mold encapsulation to define a second series of sidewalls of the plurality of leads;
electrolessly plating the first and second series of sidewalls to form wettable flanks; and
making perpendicular third and fourth series of cuts fully through the mold encapsulation to form separated discrete semiconductor packages;
wherein the electrolytic plating has a first thickness that is thicker in a direction extending perpendicular to the exposed contact surfaces of the plurality of leads than a thickness of the electroless plating in a direction extending perpendicular to the sidewalls.

9. The method of claim 8, wherein
the electrolytic plating on the exposed surfaces of the plurality leads of the lead frame is approximately three times thicker in the direction extending perpendicular to the exposed contact surfaces of the plurality of leads than the thickness of electroless plating in a direction extending perpendicular to the sidewalls of the plurality of leads.

10. The method of claim 8, wherein a width of the first and second series of parallel cuts is greater than a width of the third and fourth series of cuts.

11. A quad flat no-leads ("QFN") semiconductor package, comprising:
a lead frame comprising a plurality of leads, a die paddle, and one or more integrated circuit dies,
a mold encapsulation surrounding at least portions of the lead frame while leaving exposed bottom contact surfaces of the plurality of leads, exposed bottom contact surface of the die paddle and exposed sidewalls of the plurality of leads, the mold encapsulation comprising a stepped side surface configuration having a first side portion adjacent to a wider surface of the package and a second side portion adjacent to a narrower surface of the package, the second side portion comprising the exposed sidewalls of the plurality of leads, the stepped side surface configuration forming step-cut wettable flanks;
a first plating layer having a first thickness on the exposed bottom contact surfaces of the plurality of leads and the exposed bottom contact surface of the die paddle; and
a second plating layer having a second thickness on the exposed sidewalls of the plurality of leads, the second plating layer covering the exposed sidewalls of the plurality of leads;
wherein the first plating layer comprises electrolytically deposited plating and the second plating layer comprises electrolessly deposited plating and wherein the first plating layer has a thickness in a direction extending perpendicular to the exposed contact surfaces of the plurality of leads greater than a thickness of the second plating layer in a direction perpendicular to the sidewalls.

12. The quad flat no-leads ("QFN") semiconductor package of claim 11, wherein the electrolytic plating on the exposed surfaces of the plurality leads of the lead frame is approximately three times thicker than the electroless plating on the first and second series of sidewalls of the plurality of leads.

13. The quad flat no-leads ("QFN") semiconductor package of claim 11, wherein the sidewalls of the plurality of leads do not extend to the first side portion of the mold encapsulation.

* * * * *